United States Patent
Ylilammi et al.

[11] Patent Number: 5,873,154
[45] Date of Patent: Feb. 23, 1999

[54] METHOD FOR FABRICATING A RESONATOR HAVING AN ACOUSTIC MIRROR

[75] Inventors: Markku Antero Ylilammi; Meeri Talvilelei Partanen, both of Espoo, Finland

[73] Assignee: Nokia Mobile Phones Limited, Salo, Finland

[21] Appl. No.: 733,177

[22] Filed: Oct. 17, 1996

[51] Int. Cl.⁶ .................................. H01L 41/22
[52] U.S. Cl. .................. 29/25.35; 310/324; 310/334; 427/100
[58] Field of Search .............. 29/25.35; 427/100; 310/324, 310, 326, 334

[56] References Cited

U.S. PATENT DOCUMENTS

| | | | |
|---|---|---|---|
| 3,173,100 | 3/1965 | White | 330/35 |
| 3,293,557 | 12/1966 | Denton | 330/4.6 |
| 3,486,046 | 12/1969 | Zalar | 310/8 |
| 3,568,108 | 3/1971 | Poirier et al. | 333/30 |
| 3,686,579 | 8/1972 | Everett | 330/5.5 |
| 3,696,312 | 10/1972 | Kuhn et al. | 333/24 R |
| 3,760,471 | 9/1973 | Borner | 29/25.35 |
| 3,764,928 | 10/1973 | Gires et al. | 330/5.5 |
| 3,916,490 | 11/1975 | Sheahan et al. | 29/25.35 |
| 3,924,312 | 12/1975 | Coussot et al. | 29/25.35 |
| 4,019,181 | 4/1977 | Olsson et al. | 343/6.5 |
| 4,166,967 | 9/1979 | Benes et al. | 310/338 |
| 4,320,365 | 3/1982 | Black et al. | 333/187 |
| 4,368,401 | 1/1983 | Martin et al. | 310/324 |
| 4,418,299 | 11/1983 | Momosaki | 310/361 |
| 4,456,850 | 6/1984 | Inoue et al. | 310/324 |
| 4,502,932 | 3/1985 | Kline et al. | 204/192 |
| 4,556,812 | 12/1985 | Kline et al. | 310/324 |
| 4,562,370 | 12/1985 | Von Dach | 310/312 |
| 4,628,223 | 12/1986 | Takeuchi et al. | 310/334 X |
| 4,635,216 | 1/1987 | Minagawa et al. | 333/153 |
| 4,642,508 | 2/1987 | Suzuki et al. | 310/321 |
| 4,747,192 | 5/1988 | Rokurota | 310/334 X |
| 4,897,618 | 1/1990 | Svetanoff | 331/76 |
| 4,907,207 | 3/1990 | Moeckl | 310/324 X |
| 5,153,476 | 10/1992 | Kosinski | 310/313 R |
| 5,162,691 | 11/1992 | Mariani et al. | 310/321 |
| 5,166,646 | 11/1992 | Avanic et al. | 331/107 A |
| 5,185,589 | 2/1993 | Krishnaswamy et al. | 333/133 |
| 5,233,259 | 8/1993 | Krishnaswamy et al. | 310/324 |
| 5,373,268 | 12/1994 | Dworsky et al. | 333/187 |

(List continued on next page.)

FOREIGN PATENT DOCUMENTS

| | | | |
|---|---|---|---|
| 0 609 555 A2 | 12/1993 | European Pat. Off. . | |
| 62-76913 (A) | 4/1987 | Japan | 310/324 |

OTHER PUBLICATIONS

"Acoustic Bulk Wave Composite Resonators", K. Lakin, Appl. Phys. Lett. (38)3, 1 Feb. 1981, pp. 125–127.

(List continued on next page.)

Primary Examiner—Carl E. Hall
Attorney, Agent, or Firm—Perman & Green, LLP

[57] ABSTRACT

A Thin Film Bulk Acoustic Wave Resonator (FBAR), comprising a top electrode layer, a substrate, an acoustic mirror that is formed atop the substrate, and a piezoelectric layer that is formed between the top electrode layer and the acoustic mirror. The acoustic mirror is comprised of a plurality of stacked layers. One of the stacked layers forms a bottom electrode layer. At least another one of the stacked layers comprises a polymer material. The piezoelectric produces vibrations in response to a voltage being applied between the top electrode and the bottom electrode. The acoustic mirror acoustically isolates these vibrations from the substrate. The polymer material is preferably an electronic grade polymer and has a capability of withstanding a deposition of the piezoelectric layer at an elevated temperature. The layers forming the acoustic mirror which do not comprise the polymer material comprise a high acoustic impedance material such as, by example, tungsten (W). The polymer material can be spun on the substrate during fabrication of the FBAR.

22 Claims, 4 Drawing Sheets

U.S. PATENT DOCUMENTS

| | | | |
|---|---|---|---|
| 5,382,930 | 1/1995 | Stokes et al. | 333/191 |
| 5,422,533 | 6/1995 | Kosinski et al. | 310/335 |
| 5,446,306 | 8/1995 | Stokes et al. | 257/416 |
| 5,587,620 | 12/1996 | Ruby et al. | 310/346 |
| 5,596,239 | 1/1997 | Dydyk | 310/311 |
| 5,646,583 | 7/1997 | Seabury et al. | 333/187 |
| 5,692,279 | 12/1997 | Mang et al. | 29/25.35 |

OTHER PUBLICATIONS

"Systematic Design of Stacked–Crystal Filters by Microwave Network Methods", A. Ballato, IEEE Trans. of Microwave Theory and Techniques, vol., MTT–22, No. 1, Jan., 1974, pp. 14–25.

"Multi–Layered Ultrasonic Transducers Empolying Air–Gap Structure", S. Yoshimoto, IEEE Trans. of Ultrasonic . . . , vol. 42, No. 3, May, 1995, p. 339–343.

"Design of Unapodized Surface–Wave Transducers with Spectral Weighting", G. Nudd, IEE Trans. on Microwave Theory and Techniques, vol. MTT–22, No. 1, Jan., 1974, pp. 14–23.

"Development of Miniature Filters for Wireless Applications", K. Lakin et al. , IEEE MTT–S Digest, 1995, pp. 883–886.

"Temperature Compensated High Couplijng and High . . . Substrates", T. Shiosaki et al., Ultrasonic Symposium, 1984, pp. 405–410.

"An Air–Gap Type Piezoelectric Composite Thin Film Resonator", H. Satoh et al., IEEE, 1985, pp. 361–366.

"Coplanar Waveguides and Microwave Inductors on Silicon Substrates", A. Reyes, IEEE, 1995, pp. 2016–2021.

"Ultrasonic in Integrated Electronics", W. Newell, Proceedings of the IEEE, pp. 1305–1309.

Lakin, K. M. et al., "Thin Film Bulk Acoustic Wave Filters For GPS", IEEE 1992, pp. 471–476.

Driscoll, M.M., et al., Recent Advances In Monolithic Film Resonator Technology, IEEE 1986, pp. 365–369.

"A Monolithic piezoelectric amplitude modulator" by K.P. Bransalov Int. J. Electronics, 1979 vol. 47, No. 6, pp. 545–553.

"Ultralinear Small–angle Phase Modulator" by John Lowe and F. L. Walls Symposium on Frequency Control May 29, 1991, pp. 645–648.

| LAYER AND THICKNESS | LONGITUDINAL WAVE | SHEAR WAVE |
|---|---|---|
| TOP W 200 nm | 5231 m/s 101 Gg/m²s | 2860 m/s 55.2 Gg/m²s |
| ZnO 940 nm<br>$\varepsilon_r$=8.84<br>A=40000 $\mu$m² | 6330 m/s<br>36 Gg/m²s<br>e= 1.14 C/m² | 2720 m/s<br>15.5 Gg/m²s<br>e= 0.5 C/m² |
| BOTTOM W 1377 nm | 5231 m/s 101 Gg/m²s | 2860 m/s 55.2 Gg/m²s |
| POLYMER 526 nm | 2000 m/s 2 Gg/m²s | 1000 m/s 1 Gg/m²s |
| GLASS | 13.1 Gg/m²s | 7.6 Gg/m²s |
| SERIES RESONANCE | 977.5 MHz | 444.1 MHz |
| PARALLEL RESONANCE | 1002.6 MHz | 458.2 MHz |
| STATIC CAPACITANCE | 3.331 pF | 3.331 pF |
| MECHANICAL CAPACITANCE | 173.8 fF | 215.7 fF |
| MECHANICAL INDUCTANCE | 0.153 $\mu$H | 0.596 $\mu$H |
| COUPLING $k_{eff}$ | 0.2227 | 0.2466 |
| Q | 876 | 1228 |
| SERIES RESISTANCE | 1.07 Ω | 1.35 Ω |

METHOD FOR FABRICATING A RESONATOR HAVING AN ACOUSTIC MIRROR

FIELD OF THE INVENTION

The invention relates resonators and, in particular, the invention relates to a Thin Film Bulk Acoustic Wave Resonator that includes an acoustic mirror.

BACKGROUND OF THE INVENTION

It is known in the art to provide resonators that comprise membrane or film layers. By example, in an article entitled "Acoustic Bulk Wave Composite Resonators", Applied Physics Lett., Vol. 38, No. 3, pp. 125–127, Feb. 1, 1981, by K. M. Lakin and J. S. Wang, an acoustic bulk wave resonator is comprised of a thin film piezoelectric layer of Zinc-Oxide (ZnO) sputtered over a thin membrane of Silicon (Si). The resonator exhibits high acoustic reflectivity characteristics at interfaces between the air and the device, therefore enabling the device to have a suitable figure of merit (Q). Notwithstanding the beneficial characteristics of the device, the fabrication of resonator filters comprising thin membranes is a cumbersome process, requiring, by example, the deposition of the membrane layer and then the performance of photolithographic steps.

In view of these problems, resonators have been fabricated which incorporate so called "acoustic mirrors" instead of membranes. An example of one these devices is disclosed in the article entitled "Ultrasonics in Integrated Electronics", Proc. IEEE, Vol. 53, October 1965, pp. 1305–1309, by W. E. Newell. For these types of resonators, the acoustic mirror may comprise a lower layer having a low acoustic impedance and a thickness of, by example, one-quarter wavelength, and an upper layer having a high acoustic impedance and a high reflectivity characteristic. The lower layer functions as an "impedance converter" since it can transform the acoustic impedance of a substrate to a very low value. For a case in which each of the layers has a thickness of one-quarter wavelength, the conversion factor of the pair of layers is equal to the square of a ratio of their respective impedances.

Another example of a device incorporating an acoustic mirror structure instead of a membrane may be found in an article entitled "Development of Miniature Filters for Wireless Applications", IEEE MTT-S Digest, 1995, pp. 883–886, by K. M. Lakin, G. R. Kline, and K. T. McCarron.

Unfortunately, because many layers need to be formed to create these types of devices, it can be difficult to form the layers to have precise "design" thicknesses. Also, during the fabrication of these resonators the process of sputtering the layers can consistently result in the layers having incorrect thicknesses. A further problem with these types of resonators is that the intrinsic stress of the layer materials forming the resonators can inevitably strain the lower stack layers, eventually resulting in at least one of these layers being peeled from the substrate. This problem becomes more severe for resonators having thicker layer stacks.

Another article is entitled "Temperature Compensated High Coupling and High Quality Factor ZnO/SiO$_2$ Bulk Wave Resonators on High Resistance Substrates", IEEE 1984 Ultrasonics Symp., pp. 405–410, by T. Shiosaki, T. Fukuichi, M. Tokuda, and A. Kawabata. This article discloses a bulk wave resonator that includes an insulating silicon-dioxide (SiO$_2$) film. The device eliminates an influence of a parasitic parallel branch formed between a top electrode and a bottom electrode of the resonator.

OBJECTS OF THE INVENTION

It is an object of this invention to provide an improved Thin Film Bulk Acoustic Wave Resonator (FBAR) having an acoustic mirror for acoustically isolating a vibrating piezoelectric layer from a substrate.

Further objects and advantages of this invention will become apparent from a consideration of the drawings and ensuing description.

SUMMARY OF THE INVENTION

The foregoing and other problems are overcome and the objects of the invention are realized by a Thin Film Bulk Acoustic Wave Resonator (FBAR) comprising an acoustic mirror constructed in accordance with this invention.

In accordance with one embodiment of the invention, the FBAR comprises a top electrode layer, a piezoelectric layer, an acoustic mirror, and a substrate. The acoustic mirror is comprised of a bottom electrode layer (also referred to as a "first acoustic mirror layer"), a second acoustic mirror layer, and a third acoustic mirror layer. The piezoelectric layer is formed between the top and bottom electrode layers, and the second acoustic mirror layer is formed between the bottom electrode layer and the third acoustic mirror layer. The third acoustic mirror layer is situated atop the substrate.

The top electrode layer is preferably comprised of a metal having a high acoustic impedance such as, by example, tungsten. The top electrode layer also preferably has a thickness of, by example, 200 nm. The bottom electrode layer also preferably comprises a metal having a high acoustic impedance such as, by example, tungsten. Similarly, the third acoustic mirror layer preferably comprises a material having a high acoustic impedance. The bottom electrode layer and the third acoustic mirror layer have respective thicknesses of, by example, 1300 nm. The piezoelectric layer preferably comprises zinc-oxide (ZnO) and has a thickness of, by example, 950 nm.

In this embodiment of the invention, the second acoustic mirror layer is comprised of a material having a low acoustic impedance. Preferably, the second acoustic mirror layer is comprised of silicon-dioxide (SiO$_2$), and has a thickness of, by example, 1490 nm.

Having layers with the characteristics described above, the FBAR exhibits a resonance at a fundamental frequency of approximately 1000 MHz. Also, assuming that the acoustic mirror is the only lossy portion of the FBAR, the FBAR exhibits a figure of merit (Q) (also referred to as a "(Q) value") that is approximately equal to 1270. An impedance conversion factor (CF) of the FBAR has been calculated to equal 3533.

The acoustic mirror isolates vibrations produced by the piezoelectric layer from the substrate while the piezoelectric layer resonates in response to, a voltage being applied across the top and bottom electrode layers. Also, the acoustic mirror transforms the impedance level of the substrate to a lower value.

According to another embodiment of the invention, an FBAR is provided which has an acoustic mirror comprising five layers, two of which are comprised of silicon-dioxide (SiO$_2$), and three of which are preferably comprised of tungsten (W).

In accordance with a further embodiment of the invention, an FBAR is provided which incorporates a polymer layer. This FBAR comprises a top electrode layer, a piezoelectric layer, an acoustic mirror, and a substrate. The acoustic mirror comprises a bottom electrode layer, and the polymer layer. The top electrode layer comprises a metal (e.g., tungsten (W)) having a high acoustic impedance, and has a thickness of, by example, 200 nm. The bottom electrode layer also comprises a metal (e.g., tungsten (W)) having a high acoustic impedance and a thickness of, by example, 1300 nm. The piezoelectric layer is preferably comprised of zinc-oxide (ZnO) or aluminum nitride (AlN) and has a thickness of, by example, 950 nm when zinc-oxide (ZnO) is used.

The polymer layer may be comprised of any polymer material having a low loss characteristic and a low acoustic impedance. However, because conventional polymers cannot withstand the high temperatures that can be reached when piezoelectric layers are sputtered or otherwise deposited over acoustic mirrors during fabrication, a high performance electronic grade polymer is preferred. This polymer can withstand temperatures of at least 350° C. As such, it can withstand the temperatures (e.g., 300° C.) normally reached during the sputtering of piezoelectric layers formed of, by example, zinc-oxide (ZnO) or Aluminum Nitride (AlN). The polymer layer may be comprised of, by example, polyimide, cyclotene, a carbon-based material, a silicon-based material, or any other suitable material. The polymer layer has a thickness of, by example, 500 nm and an acoustic impedance as low as 2 $Gg/m^2s$.

The FBAR incorporating the polymer exhibits a fundamental resonance at approximately 1000 MHz, and has an impedance conversion factor (CF) that is approximately equal to 2550. Also, assuming that only the acoustic mirror portion of the FBAR is lossy, the FBAR has a (Q) value of approximately 880.

In a further embodiment of the invention, an FBAR is provided which has an acoustic mirror comprising two low acoustic impedance polymer layers formed on opposite sides of a high acoustic impedance layer.

In accordance with another aspect of the invention, a method for fabricating an FBAR is provided. The method includes the steps of: (A) forming an acoustic mirror on a substrate, wherein a portion of the acoustic mirror includes a polymer material and a bottom electrode; (B) forming a piezoelectric layer on the acoustic mirror; and (C) forming a top electrode on the piezoelectric layer.

Step (A) may be performed by spinning the polymer material on the substrate. Also, step (B) may be performed by, for example, sputtering or otherwise depositing (using a thin film technology) a piezoelectric material at a high temperature on at least a portion of the acoustic mirror. Preferably, the polymer layer has the capabilities described above.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
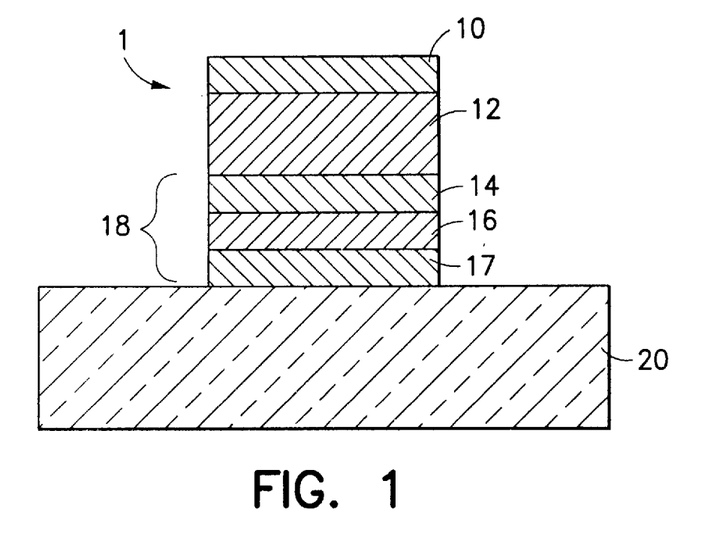
FIG. 1 illustrates a cross section of a Thin Film Bulk Acoustic Wave Resonator (FBAR) that is constructed in accordance with one embodiment of the invention.

FIG. 1 illustrates a cross section of a Thin Film Bulk Acoustic Wave Resonator (FBAR) 1 that is constructed in accordance with one embodiment of the invention. The FBAR 1, which can function as, by example, a portion of a filter, is comprised of a top electrode layer 10, a piezoelectric layer 12, an acoustic mirror 18, and a substrate 20. The acoustic mirror 18 is comprised of a bottom electrode layer (also referred to as a "first acoustic mirror layer") 14, a second acoustic mirror layer 16, and a third acoustic mirror layer 17. The piezoelectric layer 12 is formed between the top and bottom electrode layers 10 and 14, and the second acoustic mirror layer 16 is formed between the bottom electrode layer 14 and the third acoustic mirror layer 17. A bottom surface of the third acoustic mirror layer 17 is in contact with a top surface of the substrate 20.

The top electrode layer 10 is preferably comprised of tungsten (W) and has a thickness of, by example, 200 nm. The velocity at which longitudinal elastic waves travel through the layer 10 is 5231 m/s. The acoustic impedance of the layer 10 is 101 $Gg/m^2s$. The bottom electrode layer 14 and the third acoustic mirror layer 17 also preferably comprise tungsten (W), which has a high characteristic acoustic impedance. These layers 14 and 17 have respective thicknesses of, by example, 1300 nm. The velocity at which longitudinal elastic waves travel through layers 14 and 17 is 5231 m/s, and each of the layers 14 and 17 has an acoustic impedance of 101 $Gg/m^2s$. The piezoelectric layer 12 preferably comprises zinc-oxide (ZnO) and has a thickness of, by example, 950 nm. Longitudinal elastic waves travel through ZnO layer 12 at a velocity of 6330 m/s, and the layer 12 has an acoustic impedance of 36 $Gg/m^2s$. Other suitable piezoelectric film materials may be used in lieu of zinc-oxide (ZnO) to form the piezoelectric layer 12 including, by example, aluminum nitride (AlN).

It should be noted that although the top electrode layer 10 and the bottom electrode layer 14 are preferably comprised of tungsten (W), these layers may also be comprised of any other suitable metal including, by example, aluminum (Al), copper (Cu), molybdenum (Mo), nickel (Ni), titanium (Ti), niobium (Nb), silver (Ag), gold (Au), and tantalum (Ta). Preferably, the material used to form the top and bottom electrode layers 10 and 14 is an electrically conductive metal having a high acoustic impedance. The third acoustic mirror layer 17 may comprise similar materials or any other suitable material having a high acoustic impedance including, by example, $Al_2O_3$ or $LiNbO_3$. It should be noted that the metals described above with respect to the layers 10 and 14 may also be used to form the electrodes of the embodiments of the invention to be described below.

The second acoustic mirror layer 16 is comprised of a material having a low characteristic acoustic impedance. Preferably the second acoustic mirror layer 16 is comprised of silicon-dioxide ($SiO_2$), and has a thickness of, by example, 1490 nm. The velocity of a longitudinal elastic wave travelling through this layer 16 is 5970 m/s and the acoustic impedance of the layer 16 is 13.1 $Gg/m^2s$. The substrate 20 preferably comprises glass and also has an acoustic impedance of 13.1 $Gg/m^2s$. The substrate 20 may also comprise other suitable materials in lieu of glass such as, by example, silicon or gallium arsenide.

Having layers with the characteristics described above, the FBAR 1 exhibits a resonance at a fundamental frequency of approximately 1000 MHz. Also, assuming that the acoustic mirror 18 is the only lossy portion of the FBAR 1, the FBAR 1 exhibits a figure of merit (Q) (also referred to as a "(Q) value") that is approximately equal to 1270. Additionally, an impedance conversion factor of the FBAR 1 has been calculated to equal 3533, as will be described below.

The acoustic mirror 18 isolates vibrations produced by the piezoelectric layer 12 from the substrate 20. By example, in response to a voltage being applied across the top and bottom electrode layers 10 and 14, the piezoelectric layer 12 resonates, causing vibrations to emanate from the layer 12 to other portions of the FBAR 1 including, by example, the acoustic mirror 18. As the vibrations propagate from the layer 12 through the acoustic mirror 18, they experience various acoustic impedances including, by example, an acoustic impedance at an interface between layers 12 and 14, an acoustic impedance at an interface between layers 14 and 16, an acoustic impedance at an interface between layers 16 and 17, and an acoustic impedance at an interface between layer 17 and the substrate 20. Owing at least in part to these impedances, the vibrations become partly reflected at each interface in a direction that is not towards the substrate 20. As a result, the reflected portions do not ultimately reach the substrate 20. In this manner the acoustic mirror 18 isolates the vibrating piezoelectric layer 12 from the substrate 20. Also, the acoustic mirror 18 transforms the impedance of the substrate 20 to a lower value. This may be further understood in view of the calculations that will be described below.

Resonators having acoustic mirrors that comprise a single pair of layers formed of conventional materials may not exhibit sufficiently high conversion factors. By example, a structure which is comprised of a layer of silicon-dioxide ($SiO_2$) and a layer of tungsten (W) causes a substrate acoustic impedance to be either multiplied or divided by a factor of 60, which may not be sufficient for some applications.

Figure 3:
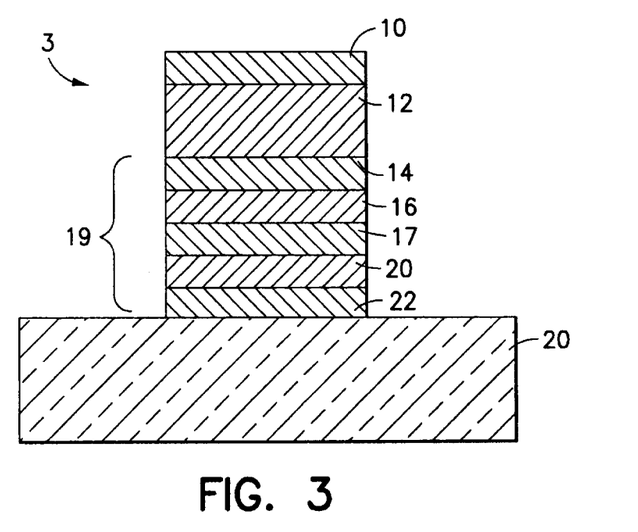
FIG. 3 illustrates a cross section of an exemplary FBAR that is constructed in accordance with another embodiment of the invention.

Thus, in accordance with an alternate embodiment of the invention, which is illustrated in FIG. 3, FBAR 3 is provided which comprises an acoustic mirror 19 having more than two layers. The FBAR 3 is constructed of similar elements as the FBAR 1 of FIG. 1. However, in addition to the first, second and third acoustic mirror layers 14, 16, and 17, respectively, the acoustic mirror 19 comprises a fourth acoustic mirror layer 20, and a fifth acoustic mirror layer 22. Like the second acoustic mirror layer 16, the fourth acoustic mirror layer 20 is preferably comprised of silicon-dioxide ($SiO_2$), and has a thickness of, by example, 1490 nm. The velocity of a longitudinal elastic wave travelling through this layer 20 is 5970 m/s and the characteristic acoustic impedance of the layer 20 is 13.1 $Gg/m^2s$. Also, like the first and third acoustic mirror layers 14 and 17, the fifth acoustic mirror layer 22 preferably comprises a material having a high acoustic impedance such as, for example, tungsten (W), and has a thickness of, by example, 1300 nm. The fifth acoustic mirror layer 22 also has a characteristic acoustic impedance of 101 $Gg/m^2s$. Moreover, the velocity at which longitudinal elastic waves travel through this layer 22 is 5231 m/s.

The acoustic mirror 19 of the FBAR 3 acoustically isolates vibrations produced by the piezoelectric layer 12 from the substrate 20 in a manner similar to that described above. However, because the acoustic mirror 19 of the FBAR 3 comprises more layers than that of the FBAR 1 of FIG. 1, the acoustic mirror 19 provides greater reflectivity for the acoustic vibrations than the acoustic mirror 18 of the FBAR 1. This is because the acoustic mirror 19 provides a greater impedance ratio, and hence a greater impedance conversion factor, than those provided by the acoustic mirror 18 of the FBAR 1.

Having described a number of embodiments of the invention, a further aspect of the invention will now be described. The inventors have recognized that low acoustic impedance polymer materials have many beneficial characteristics which make these materials better suited for use in acoustic mirrors than other types of low acoustic impedance materials. One of the beneficial attributes of polymers is that they typically have acoustic impedances that are less than those of most conventional solids by a factor of approximately 10. Because polymers have such low impedances, the inventors have recognized that they would function well as an impedance converter in an acoustic mirror. Also, this capability allows an acoustic mirror which includes a polymer to be formed of only a single pair of thin film layers, including, for example, a low acoustic impedance polymer layer and a high acoustic impedance layer. Another advantage of using polymers is that they can be spun on during the fabrication of FBAR structures. For example, a polymer can be spun on a substrate or a high acoustic impedance layer which forms a portion of an acoustic mirror. A small amount of the polymer in liquid form is dropped on the substrate or the high acoustic impedance layer which is then rotated to form the polymer layer. Because polymers can be spun on in this manner, polymer layers in FBARs have smooth surfaces. Also, heating liquifies polymer surfaces and produces smooth interfaces between the polymers and layers formed over the polymers. Thus, a layer that is deposited over the polymer layer does not experience surface deformations as serious as those which can occur to layers deposited over non-polymer layers.

It is known to use polymers in other types of devices besides resonators, as is evidenced by an article entitled "Multi-layered Ultrasonic Transducers Employing Air-Gap Structure", IEEE Trans. Ultras. Ferro. Freq. Cont., Vol. 42, No. 3, May 1995, pp. 339–344, by Susumu Yoshimoto, Masamichi Sakamoto, Ken-ya Hashimoto, and Masatsune Yamaguchi. This article discloses a multi-layered ultrasonic transducer incorporating a polymer layer which functions as a "matching" layer through which elastic waves are transferred to a water load. Also, in integrated circuit fabrication technology, polymers can be utilized as dielectric films between metallic layers, and are also used to planarize wafer surfaces in order to enhance sub-micron photolithographic processes.

Figure 2:
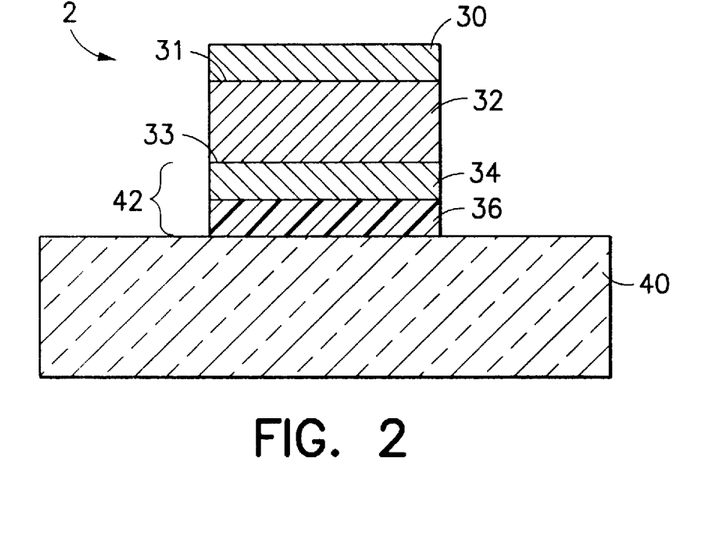
FIG. 2 illustrates a cross section of an exemplary FBAR that is constructed in accordance with another embodiment of the invention, wherein the FBAR includes an acoustic mirror comprising a polymer layer.

Therefore, in accordance with a further embodiment of the invention, an FBAR 2 is provided which includes an acoustic mirror 42 having a polymer layer 36. The FBAR 2 is illustrated in FIG. 2. The FBAR 2 comprises a top electrode layer 30, a piezoelectric layer 32, acoustic mirror 42, and a substrate 40. The acoustic mirror 42 comprises a bottom electrode layer 34, and the polymer layer 36. The top electrode layer 30 may comprise any suitable metal (e.g., a dense metal which may have a high atomic weight) having a high acoustic impedance. Preferably, the top electrode layer 30 comprises tungsten (W), which has the highest known acoustic impedance of any material. The top electrode layer 30 also preferably has a thickness of, by example, 200 nm. The velocity at which longitudinal elastic waves travel through the top electrode layer 30 is 5231 m/s, and the characteristic acoustic impedance of the layer 30 is 101 Gg/m²s. The bottom electrode layer 34 may also comprise any suitable metal (e.g., a dense metal which may have a high atomic weight) having a high acoustic impedance. Preferably, the bottom electrode layer 34 comprises tungsten (W) having a thickness of, by example, 1300 nm. The velocity at which longitudinal elastic waves travel through this layer 34 is 5231 m/s, and the characteristic acoustic impedance of the layer 34 is 101 Gg/m²s.

The piezoelectric layer 32 is preferably comprised of zinc-oxide (ZnO), aluminum nitride (AlN), or some other suitable piezoelectric film material. Where zinc-oxide (ZnO) is used, the piezoelectric layer 32 has a thickness of, by example, 950 nm. Longitudinal elastic waves travel through ZnO layer 32 at a velocity of 6330 m/s, and the layer 32 has a characteristic acoustic impedance of 36 Gg/m²s. The substrate 40 preferably comprises glass, although other suitable materials may be employed in lieu of glass such as, by example, silicon or gallium arsenide.

The polymer layer 36 may be comprised of any polymer material having a low loss characteristic and a low acoustic impedance. However, because many polymers cannot withstand the high temperatures that can be reached when piezoelectric layers are sputtered or otherwise deposited over acoustic mirrors during fabrication, a high performance electronic grade polymer is preferred. This polymer can withstand temperatures of at least 350° C. As such, it can withstand temperatures (e.g., 300° C.) normally reached during the sputtering of piezoelectric layers formed of, by example, zinc-oxide (ZnO) or aluminum nitride (AlN). The polymer layer 36 may be comprised of, by example, polyimide, cyclotene, a carbon-based material, a silicon-based material, or any other suitable material. The polymer layer has a thickness of, by example, 500 nm and an acoustic impedance as low as 2 Gg/m²s. In accordance with these characteristics, longitudinal elastic waves travel through the polymer layer 36 at a velocity of approximately 2000 m/s.

It should be noted that these characteristics and parameters are not intended to be limiting to the invention's scope. For example, other suitable layer thicknesses and cross-sectional areas may be chosen in accordance with applicable electrical performance criteria in order to optimize the FBAR's frequency response. Factors that may be considered in determining appropriate layer thicknesses include, by example, the lossiness and the acoustic impedances of FBAR layers, effective piezoelectric coupling (i.e., which determines filter bandwidth), the temperature coefficient of the FBAR, as well as the behavior of the FBAR 2 at even and odd harmonic intervals. In applications wherein the FBAR 2 must have a high (Q) value, the thicknesses of the acoustic mirror layers 34 and 36 must be an odd multiple of one-quarter wavelength. Other factors that may be considered include, by example, whether an orthogonal wavemode (i.e., a shear wave for a longitudinal device) exists.

The FBAR 2 having the particular characteristics and parameters described above exhibits a fundamental resonance at approximately 1000 MHz, and has an impedance conversion factor (CF) that is approximately equal to 2550.

Also, assuming that only the acoustic mirror 42 portion of the FBAR 2 is acoustically lossy, the FBAR 2 has a (Q) value of approximately 880. These parameters may be better understood in view of the following exemplary calculations for determining a conversion factor (CF) and a (Q) value, and in consideration of the drawings illustrated in FIGS. 6 and 7.

Figure 6:
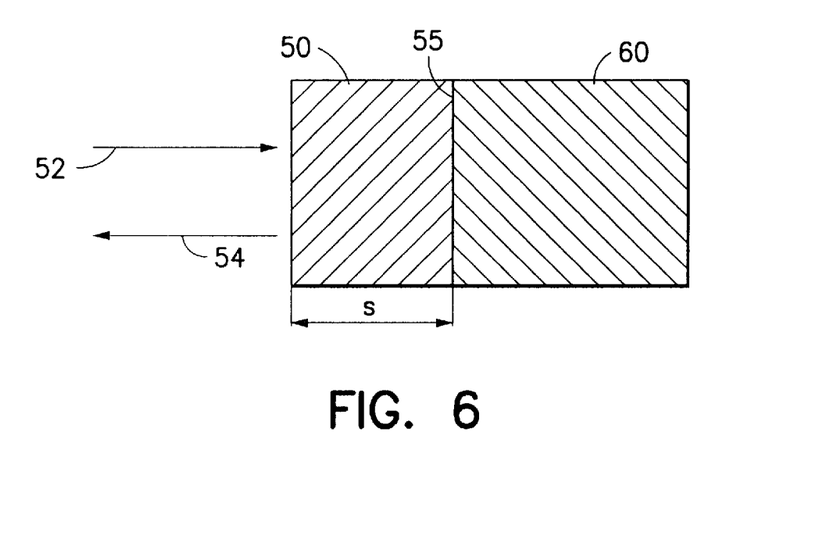
FIG. 6 illustrates an exemplary representation of a substrate, an acoustic mirror layer, an incident wave, and a reflected wave.

FIG. 6 shows an exemplary representation of acoustic mirror structure and a substrate layer 60. The acoustic mirror structure is formed of a single layer 50 (e.g., a polymer layer), and is situated adjacent to the substrate layer 60. The layer 50 is formed of a material designated as "material c", and has an acoustic impedance of $Z_c$ and an acoustic velocity of $v_c$. Also, the layer 50 has a thickness which is designated as "s". Layer 60 comprises a material designated as "material b", and has an acoustic impedance of $Z_b$. Assuming that each of the layers 50 and 60 is a loss-free layer, an incident acoustic wave (indicated by the arrow labelled "52") that is applied to layer 50 and which thereafter propagates through the layer 50 to the interface 55 experiences an impedance $Z_1$ at the interface 55. The impedance $Z_1$ may be represented by the equation (1):

$$Z_1 = \frac{Z_b \cos\beta s + jZ_c \sin\beta s}{jZ_b \sin\beta s + Z_c \cos\beta s} \quad (1)$$

wherein j is an imaginary number and $\beta = 2\pi/\lambda$.

Assuming, by example, that the thickness "s" is equal to one-quarter wavelength (i.e., $s=\lambda/4$), then $\beta = \pi/2$ and the equation (1) may be reduced to the following form (equation (2)):

$$Z_1 = \frac{jZ_c}{jZ_b} Z_c = \frac{Z_c^2}{Z_b} \quad (2)$$

Equation (2) can be further reduced to a form shown as equation (3), which represents an impedance conversion factor (CF) of the structure of FIG. 6:

$$(CF) = \frac{Z_1}{Z_b} = \frac{Z_c^2}{Z_b^2} \quad (3)$$

Figure 7:
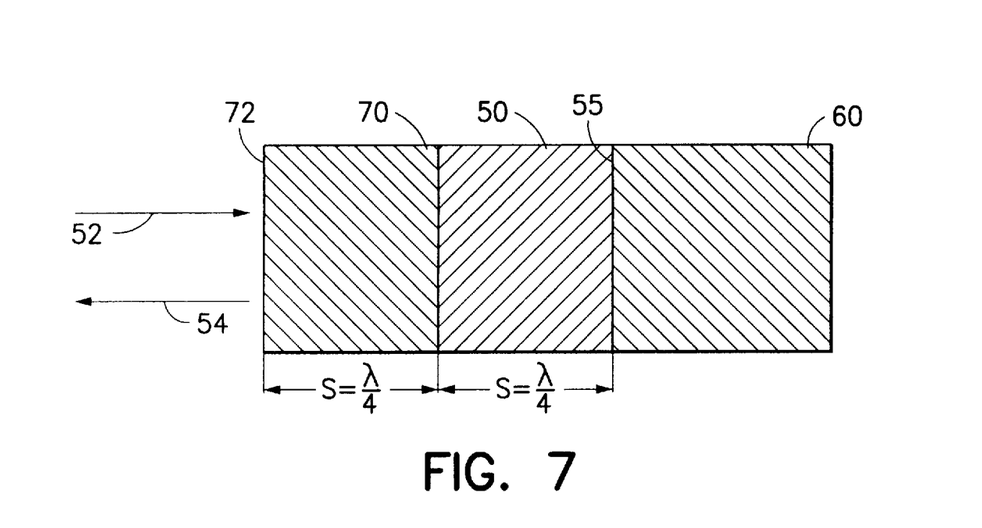
FIG. 7 illustrates an exemplary representation of a substrate, a pair of acoustic mirror layers, an incident wave, and a reflected wave.

FIG. 7 illustrates a structure similar to that of FIG. 6, with an addition of a layer (e.g., a bottom electrode layer) 70 that is situated adjacent to one side of the layer 50. The layers 50 and 70 form an acoustic mirror. Layer 70 is comprised of a material that is labelled "material a", and has a similar thickness "s" as that of layer 50. Also, the layer 70 has an acoustic impedance of $Z_a$ and an acoustic velocity of $v_a$. For a case in which each of the layers 50 and 70 have thicknesses that are equal to one-quarter wavelength (i.e., $s=\lambda/4$), the incident wave 52 experiences an impedance $Z_2$ when it reaches the interface 55. The impedance $Z_2$ may be represented by the following equation (4):

$$Z_2 = \frac{Z_a^2}{Z_1} = \frac{Z_a^2}{Z_c^2} Z_b \quad (4)$$

As such, it can be seen that the impedance $Z_b$ of the substrate layer 60 is multiplied by a square of a ratio of the impedances of layers 50 and 70. The equation (4) may be reduced to the form designated as equation (5), which represents an impedance conversion factor (CF) of the structure of FIG. 7:

$$(CF) = \frac{Z(\text{bottom of piezoelectric layer})}{Z(\text{substrate})} \quad (5)$$

wherein: (a) the variable labelled "Z (bottom of piezoelectric layer)" represents an impedance that is experienced by the incident wave 52 as it propagates through an interface 72 between a piezoelectric layer (not illustrated) and the layer 70, and (b) the variable "Z(substrate)" represents the impedance (e.g., impedance $Z_b$) of layer 60.

Referring to FIG. 2, the figure of merit (Q) of the FBAR 2 may also be calculated. For this calculation, it is assumed that there is an acoustic impedance of 33408 Gg/m²s at an interface 33 of the piezoelectric layer 32 and the bottom electrode layer 36, as can be calculated from the parameters and dimensions of the materials forming these layers. It is also assumed that the piezoelectric layer 32 has an acoustic impedance of 36 Gg/m²s. First, using the following equation (6), a reflection coefficient ($R_{bottom}$) of interface 33 is determined:

$$R = \left| \frac{Z_A - Z_B}{Z_A + Z_B} \right|^2 \quad (6)$$

wherein for this case: $Z_A$ represents the acoustic impedance of the piezoelectric layer 32, and $Z_B$ represents the acoustic impedance of the interface 33. The calculation results in a reflection coefficient ($R_{bottom}$) of approximately 0.995699.

Second, a reflection coefficient ($R_{top}$) of an interface 31 between the top electrode layer 30 and the piezoelectric layer 32 is calculated using equation (6). For this calculation, an impedance of the interface 31 is substituted for the variable $Z_B$ in equation (6). The result of this calculation (yielding reflection coefficient ($R_{top}$)) and the calculated value of $R_{bottom}$ may then be substituted into the following equation (7) in order to calculate the figure of merit (Q) of the FBAR 2:

$$Q = -\frac{\pi}{(\ln R_{top} + \ln R_{bottom})} \quad (7)$$

A solution using this equation results in a figure of merit (Q) that is equal to approximately 730. This result assumes that the FBAR layers, and the FBAR layer interfaces other than interfaces 31 and 33, are loss- free interfaces. In actuality, however, all of the FBAR's interfaces reflect acoustic waves, and layers such as, by example, the top electrode layer 30, also influence the result of the calculation. Thus, an actual figure of merit (Q) of the FBAR 2 has been determined to be approximately equal to 880.

Figure 4:
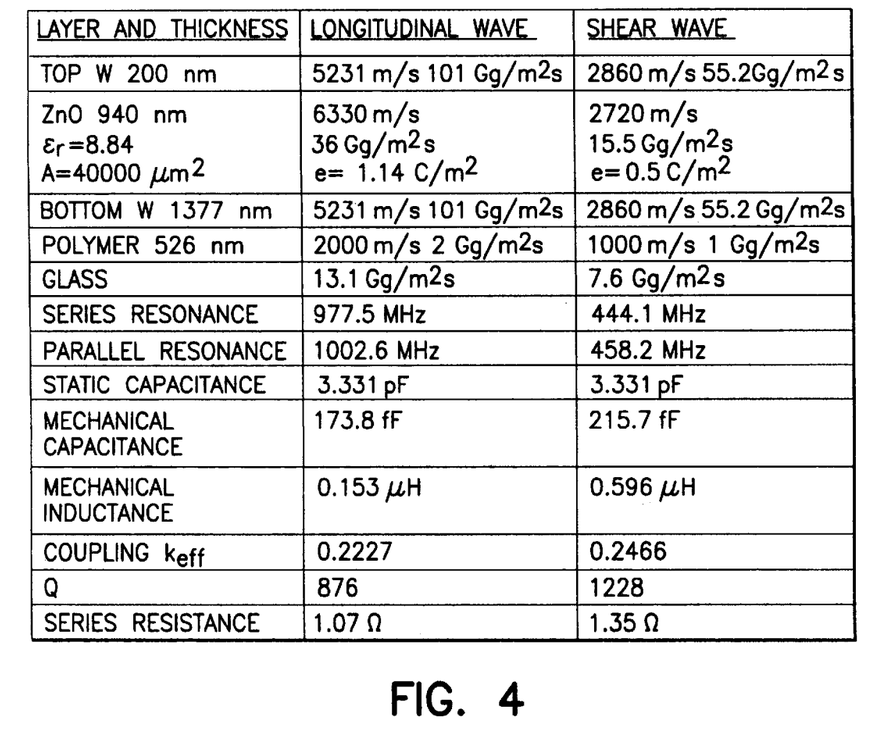
FIG. 4 illustrates a table showing various calculated parameters and performance characteristics of an exemplary FBAR.
Figure 5:
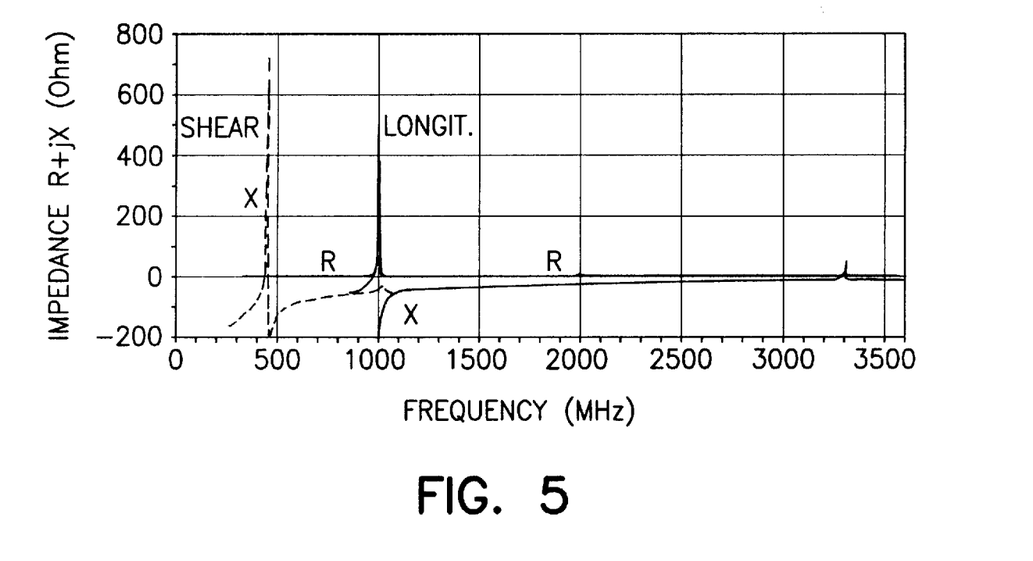
FIG. 5 illustrates a graph showing a calculated impedance curve versus frequency of the FBAR of FIG. 4.

FIG. 4 illustrates a table showing various parameters and performance characteristics of an exemplary FBAR which comprises: (1) a top electrode (designated as "Top W") that is comprised of tungsten (W) and has a thickness of 200 nm; (2) a piezoelectric layer (designated as "ZnO") that is comprised of zinc-oxide (ZnO) and has a thickness of 940 nm; (3) a bottom electrode (designated as "Bottom W") that is comprised of tungsten (W) and has a thickness of 1377 nm; (4) a polymer layer (designated as "Polymer") that has a thickness of 526 nm; and (5) a substrate (designated as "Glass") which comprises glass. The parameters listed under the columns labelled "Longitudinal wave" and "Shear wave" were calculated based upon an assumption that the materials forming the FBAR are loss-free materials. These parameters were also calculated assuming that the FBAR is designed to operate in the longitudinal wave mode. FIG. 5 illustrates a computed impedance curve versus frequency of an FBAR having the characteristics shown in the table of FIG. 4. It should be noted that each of the embodiments of the invention may be modeled using any suitable technique including the one disclosed in an article entitled "systematic Design of Stacked-Crystal Filters by Microwave Network Methods", IEEE Trans. Microwave Theory Tech., vol. MTT-22, pp. 14–25, Jan. 1974, by A. Ballato, H. L. Bertoni, and T. Tamir.

Figure 8:
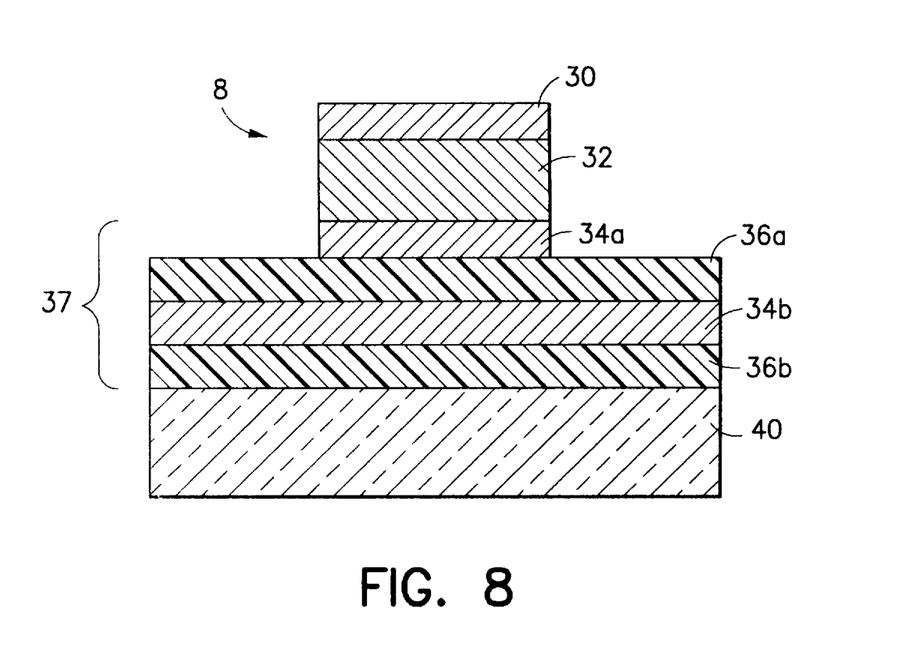
FIG. 8 illustrates a cross section of an exemplary FBAR that is constructed in accordance with a further embodiment of the invention, wherein the FBAR includes an acoustic mirror comprising a plurality of polymer layers.

FIG. 8 illustrates a further embodiment of the invention. In FIG. 8, an FBAR 8 is illustrated that is comprised of layers that are similar to those of the FBAR 2, except that the acoustic mirror 37 of the FBAR 8 comprises two polymer layers 36a and 36b formed on opposite sides of a high acoustic impedance layer 34b, and a bottom electrode layer 34a formed on the layer 36a. The high acoustic impedance layer 34b may comprise, by example, tungsten (W) or some other suitable material (e.g., a dense material which may have a high atomic weight) having a high acoustic impedance. Similarly, the bottom electrode layer 34a may comprise, by example, tungsten (W) or some other suitable metal (e.g., a dense metal which may have a high atomic weight) having a high acoustic impedance.

Each interface between the layers of the FBAR 8 reflects at least a portion of vibrations produced by the piezoelectric layer 32 in a similar manner as described above. As such, the acoustic mirror 37 acoustically isolates the substrate 40 from these vibrations and transforms the substrate's impedance to a lower level. It should be noted that other FBARs may be fabricated that are similar to the FBAR 8, but which have acoustic mirrors comprising more than two polymer layers and more than one high acoustic impedance layer 34b, as may be appropriate for particular applications.

In accordance with another aspect of the invention, a method for fabricating an FBAR is provided. The method includes the steps of: (A) forming an acoustic mirror on a substrate, wherein a portion of the acoustic mirror includes a polymer material and a bottom electrode; (B) forming a piezoelectric layer on the acoustic mirror; and (C) forming a top electrode on the piezoelectric layer.

Step (A) may be performed by spinning the polymer material on the substrate. Also, step (B) may be performed by, for example, sputtering or otherwise depositing (using a thin film technology) a piezoelectric material at a high temperature on at least a portion of the acoustic mirror. Preferably, the polymer layer is comprised of a polymer material that can withstand the temperature reached during the performance of STEP (B) without being detrimentally effected.

In accordance with the invention, step (A) may be performed by forming a plurality of stacked layers to form the acoustic mirror. Preferably, at least one of the stacked layers forms a bottom electrode layer, and at least another one of the stacked layers comprises the polymer material. Also, preferably at least another one of the layers comprises a material having a high characteristic acoustic impedance such as, by example, tungsten (W), or any other suitable material having a high acoustic impedance.

The polymer material preferably comprises an electronic grade polymer. The polymer material may be any suitable type of polymer material including those described above.

While the invention has been particularly shown and described with respect to preferred embodiments thereof, it will be understood by those skilled in the art that changes in form and details may be made therein without departing from the scope and spirit of the invention.

What is claimed is:

1. A method for fabricating a Thin Film Bulk Acoustic Wave Resonator (FBAR), comprising the steps of:

STEP A1: forming a first layer on a substrate, the first layer being comprised of a polymer;

STEP A2: forming a second, lower electrode layer on an upper surface of the first layer, wherein the first and second layers form an acoustic isolator and wherein STEP A1 includes forming the first layer so as to have a thickness which is an odd multiple of one-fourth of an acoustic wavelength, and wherein STEP A2 includes forming the second layer so as to have a thickness which is an odd multiple of one-fourth of the acoustic wavelength;

STEP B: forming a piezoelectric layer on the acoustic isolator; and

STEP C: forming an upper electrode layer on the piezoelectric layer.

2. A method as set forth in claim 1, wherein STEP B includes a step of depositing a piezoelectric material at an elevated temperature on at least a portion of the acoustic isolator to form the piezoelectric layer.

3. A method as set forth in claim 1, wherein STEP A1 includes a step of spinning the polymer on the substrate to form the first layer.

4. A method as set forth in claim 1, wherein the polymer can withstand a temperature reached during the performance of STEP B without being detrimentally effected.

5. An FBAR as set forth in claim 1, wherein the second, electrode layer comprises a material having a high characteristic acoustic impedance.

6. A method as set forth in claim 5, wherein the material having the high characteristic acoustic impedance is comprised of tungsten.

7. A method as set forth in claim 1, wherein the polymer is an electronic grade polymer.

8. A method as set forth claim 1, wherein the polymer comprises a polyimide.

9. A method as set forth claim 1, wherein the polymer comprises one of cyclotene, a silicon-based polymer material, and a carbon-based material.

10. A method as set forth in claim 1, wherein STEP A1 includes forming the first layer so as to have a thickness that is a function of a desired operating frequency.

11. A method as set forth claim 1, wherein the substrate comprises one of glass, silicon, and gallium arsenide.

12. A method as set forth claim 1, wherein the first layer has an acoustic impedance which is substantially less than an acoustic impedance of the second, electrode layer.

13. A method as set forth in claim 1, wherein the acoustic isolator isolates vibrations produced by said piezoelectric layer from said substrate.

14. A method as set forth claim 1, wherein the acoustic isolator transforms an acoustic impedance of said substrate from a first acoustic impedance to a second, lesser acoustic impedance.

15. A method for fabricating a Thin Film Bulk Acoustic Wave Resonator (FBAR), comprising the steps of:

forming a multi-layered acoustic isolator on a surface of a substrate, wherein a first plurality of layers of the acoustic isolator are comprised of a polymer having a first acoustic impedance, wherein a second plurality of layers of the acoustic isolator have a second acoustic impedance, wherein individual ones of the first plurality of layers and individual ones of the second plurality of layers are alternately disposed within the acoustic isolator, wherein one of the first plurality of layers is disposed on the substrate, and wherein one of second plurality of layers forms a lower electrode layer and is disposed on one of the first plurality of layers;

forming a piezoelectric layer on the acoustic isolator; and forming an upper electrode layer on the piezoelectric layer.

16. A method as set forth in claim 15, wherein the first acoustic impedance is less than the second acoustic impedance.

17. A method as set forth in claim 15, wherein at least one of the second plurality of layers comprises tungsten.

18. A method as set forth in claim 15, wherein the polymer is comprised of an electronic grade polymer.

19. A method as set forth claim 15, wherein the polymer comprises one of a polyimide, cyclotene, a silicon-based polymer material, and a carbon-based material.

20. A method as set forth claim 15, wherein the acoustic isolator isolates the substrate from vibrations produced by said piezoelectric layer.

21. A method as set forth claim 15, wherein the acoustic isolator transforms an acoustic impedance of said substrate from a first acoustic impedance to a second, lesser acoustic impedance.

22. A method as set forth in claim 15, wherein individual ones of the first plurality of layers are spun on.

* * * * *

UNITED STATES PATENT AND TRADEMARK OFFICE
CERTIFICATE OF CORRECTION

PATENT NO. : 5,873,154
DATED : 2/23/99
INVENTOR(S) : Markku Antero Ylilammi, Meeri Talvikki Partanen It is certified that error appears in the above-indentified patent and that said Letters Patent is hereby corrected as shown below:

```
On the title page, [75] should read:
Meeri Talvikki Partanen
```

Signed and Sealed this

Twenty-sixth Day of October, 1999

Attest:

Q. TODD DICKINSON

*Attesting Officer*  *Acting Commissioner of Patents and Trademarks*